United States Patent
Wang

(10) Patent No.: US 8,053,766 B2
(45) Date of Patent: Nov. 8, 2011

(54) SEMICONDUCTOR ELEMENT, AND DISPLAY PIXEL AND DISPLAY PANEL USING THE SAME

(75) Inventor: Chung-Fu Wang, Park (TW)

(73) Assignee: Chimei Innolux Corporation, Chu-Nan (TW)

( * ) Notice: Subject to any disclaimer, the term of this patent is extended or adjusted under 35 U.S.C. 154(b) by 159 days.

(21) Appl. No.: 12/117,597

(22) Filed: May 8, 2008

(65) Prior Publication Data

US 2008/0277653 A1 Nov. 13, 2008

(30) Foreign Application Priority Data

May 11, 2007 (TW) .............................. 96116946 A

(51) Int. Cl.
*H01L 35/24* (2006.01)
*H01L 51/00* (2006.01)

(52) U.S. Cl. ............ 257/40; 257/E51.018; 257/E51.022
(58) Field of Classification Search .................... 257/40, 257/E51.018, E51.022
See application file for complete search history.

(56) References Cited

U.S. PATENT DOCUMENTS

| | | | |
|---|---|---|---|
| 2006/0125387 A1* | 6/2006 | Adachi et al. | 313/506 |
| 2008/0079352 A1* | 4/2008 | Cok | 313/503 |
| 2009/0212281 A1* | 8/2009 | Adachi et al. | 257/40 |

* cited by examiner

*Primary Examiner* — Thien F Tran
*(74) Attorney, Agent, or Firm* — Liu & Liu

(57) ABSTRACT

In a semiconductor element, and a display pixel and a display panel using the same, the semiconductor element includes a first electrode, a second electrode, an organic light-emitting layer and a third electrode. The second electrode and the first electrode are disposed separately. The organic light-emitting layer is electrically connected with the first electrode and the second electrode. The third electrode is disposed above the organic light-emitting layer.

9 Claims, 4 Drawing Sheets

SEMICONDUCTOR ELEMENT, AND DISPLAY PIXEL AND DISPLAY PANEL USING THE SAME

This application claims the benefit of Taiwan application Serial No. 0 96116946, filed May 11, 2007, the subject matter of which is incorporated herein by reference.

BACKGROUND OF THE INVENTION

1. Field of the Invention

The invention relates in general to a semiconductor element and the display pixel and the display panel using the same, and more particularly to a light-emitting semiconductor element and the display pixel and the display panel using the same.

2. Description of the Related Art

Semiconductor technology is an impetus to electronic technologies and brings convenience to modern people in attending their everyday business.

In recent years, major breakthroughs in the organic light emitting diode (OLED) of the semiconductor industry have been made and attracted the focus of attention in the optical-electric industry.

Like an ordinary diode, an OLED emits a light by using the characteristics of the material. The electrons and the holes respectively emitted from the electron transport layer (ETL) and the hole transport layer (HTL) are combined in the emitting material layer (EML). During the combining process of the electrons and the holes, extra energy is released in the form of optical waves when the electrons are excited to return the basic state. Different materials produce different energy levels for the electrons and the holes, and so are the wavelengths and the colors of the generated light different.

Besides, the field-effect transistor (FET), a commonly used semiconductor element, is normally divided into two types: the junction field-effect transistor (JFET) and the metal-oxide-semiconductor field effect transistor (MOS).

The source, the drain and the channel of the JFET are semiconductors of the same type, but the gate is not of the same type. Therefore, there is a pn junction between the gate and the channel. During application, the junction receives an inverse bias-voltage, so that the width of the channel is controlled by the gate voltage.

The source, the drain and the channel of the MOS are semiconductors of the same type, but the gate and the channel are separated by an oxidation layer made of an insulating material. The voltage of the gate can control the width of the channel through electrical field in the channel disposed at the back of the oxidation layer.

The FET has two main applications: the signal amplifier and the electronic switch. The function of a signal amplifier is for generating a significant change in the current of the drain/source when the current of the drain/source or the voltage of the gate only has a slight change. The function of an electronic switch is for controlling the current of the drain/source to switch between two different states when the change in the current of the drain/source or the voltage of the gate is large enough.

SUMMARY OF THE INVENTION

The invention is directed to a semiconductor element and a display pixel and a display panel using the same. A stacked structure formed by the first electrode, the second electrode, the third electrode and the organic light-emitting layer integrates the functions of an OLED and a transistor in one single component, not only reducing material cost but also simplifying the manufacturing process.

According to a first aspect of the present invention, a semiconductor element including a first electrode, a second electrode, an organic light-emitting layer and a third electrode is provided. The second electrode and the first electrode are disposed separately. The organic light-emitting layer is disposed above the first electrode and the second electrode. The organic light-emitting layer is electrically connected with the first electrode and the second electrode. The third electrode is disposed above the organic light-emitting layer.

According to a second aspect of the present invention, a display pixel including a first semiconductor element and a second semiconductor element is provided. The second semiconductor element is electrically connected with the first semiconductor element. The second semiconductor element includes a first electrode, a second electrode, an organic light-emitting layer and a third electrode. The second electrode and the first electrode are disposed separately. The organic light-emitting layer is disposed above the first electrode and the second electrode. The organic light-emitting layer is electrically connected with the first electrode and the second electrode. The third electrode is disposed above the organic light-emitting layer.

According to a third aspect of the present invention, a display panel including several data lines, scan lines and display pixels is provided. Each display pixel is electrically connected with one of the data lines and one of the scan lines. Each display pixel includes a first semiconductor element and a second semiconductor element. The second semiconductor element is electrically connected with the first semiconductor element. The second semiconductor element includes a first electrode, a second electrode, an organic light-emitting layer and a third electrode. The second electrode and the first electrode are disposed separately. The organic light-emitting layer is disposed above the first electrode and the second electrode. The organic light-emitting layer is electrically connected with the first electrode and the second electrode. The third electrode is disposed above the organic light-emitting layer.

The invention will become apparent from the following detailed description of the preferred but non-limiting embodiments. The following description is made with reference to the accompanying drawings.

DETAILED DESCRIPTION OF THE INVENTION

First Embodiment

Figure 1:
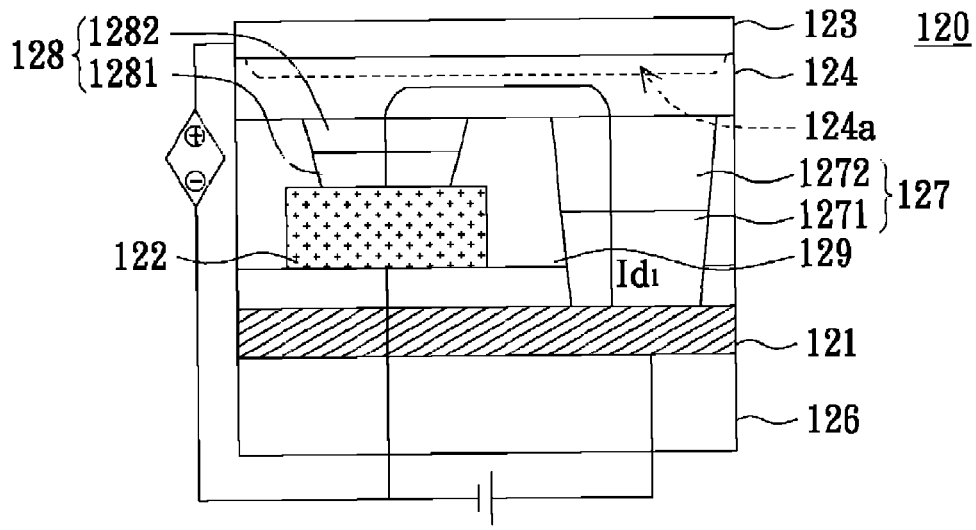
FIG. 1 is a semiconductor element according to a first embodiment of the invention.

Referring to FIG. 1, a semiconductor element 120 according to a first embodiment of the invention is shown. The semiconductor element 120 includes a substrate 126, a first electrode 121, a second electrode 122, an organic light-emitting layer 124 and a third electrode 123. The first electrode 121 and the second electrode 122 are disposed above the substrate 126. The second electrode 122 and the first electrode 121 are disposed separately. The organic light-emitting layer 124 is disposed above the first electrode 121 and the second electrode 122. The organic light-emitting layer 124 is electrically connected with the first electrode 121 and the second electrode 122. The third electrode 123 is disposed above the organic light-emitting layer 124.

In the present embodiment of the invention, the first electrode 121 is an anode, and the second electrode 122 is a cathode. Therefore, the first electrode 121, the second electrode 122 and the organic light-emitting layer 124 can be incorporated to form an OLED. To facilitate the elaboration of the polarities of the first electrode 121 and the second electrode 122, the first electrode 121 is further marked by (+) and becomes 121 (+); the second electrode 122 is further marked by (−) and becomes 122 (−).

Besides, the semiconductor element 120 further includes several hole sources 127 and several electron sources 128. The hole source 127 is disposed between the first electrode 121 (+) and the organic light-emitting layer 124. In the present embodiment of the invention, the hole source 127 include a hole injection layer (HIL) 1271 and a hole transport layer (HTL) 1272. The hole injection layer 1271 is disposed above the first electrode 121 (+). The hole transport layer 1272 is disposed between the emitting material layer 124 and the hole injection layer 1271; or, the hole source 127 includes a hole transport layer 1272 only but excludes the hole injection layer 1271.

The electron source 128 is disposed between the second electrode 122 (−) and the organic light-emitting layer 124. In the present embodiment of the invention, the electron source 128 includes an electron injection layer (EIL) 1281 and an electron transport layer (ETL) 1282. The electron injection layer 1281 is disposed above the second electrode 122 (−). The electron transport layer 1282 is disposed between the organic light-emitting layer 124 and the electron injection layer 1281; or, the electron source 128 includes an electron transport layer 1282 only but excludes the electron injection layer 1281. The electron source 128 and the hole source 127 are separated from each other by an insulating layer 129.

As indicated in FIG. 1, when a voltage is applied to the first electrode 121 (+) and the second electrode 122 (−), electrons are emitted from the second electrode 122 (−) and moved towards the organic light-emitting layer 124 through the electron source 128. Holes are emitted form the first electrode 121 (+) and moved towards the organic light-emitting layer 124 through the hole source 127. When the electrons and the holes are combined in the organic light-emitting layer 124, the light-emitting material of the organic light-emitting layer 124 is excited to emit a light. That is, the organic light-emitting layer 124 emits a light when a current Id1 flows from the first electrode 121 (+) to the second electrode 122 (−) through the organic light-emitting layer 124.

In the present embodiment of the invention, the organic light-emitting layer 124 is doped with a P-type material such as F4-TCNQ. The hole transport layer 1272 is made from m-MTDATA. The third electrode 123 is disposed above the organic light-emitting layer 124. The first electrode 121 (+) and the second electrode 122 (−) respectively are electrically connected with the organic light-emitting layer 124. The first electrode 121 (+) and the second electrode 122 (−) are separated from each other. Therefore, the first electrode 121 (+), the second electrode 122 (−), the third electrode 123, the organic light-emitting layer 124 can be incorporated to form a P-channel junction type field effect transistor (PJFET).

The first electrode 121 (+), the second electrode 122 (−) and the third electrode 123 respectively are a source, a drain and a gate of the P-channel JFET The organic light-emitting layer 124 is a P-channel. For convenience of elaboration, the first electrode 121 (+) is further marked by (S) and becomes 121 (+S); the second electrode 122 (−) is further marked by (D) and becomes 122 (−D); the third electrode 123 is further marked by (G) and becomes 123 (G).

The interface between the third electrode 123 (G) and the organic light-emitting layer 124 forms a void 124a. When the electrical difference between the second electrode 122 (−D) and the first electrode 121 (+S) equals 0, the current Id1 on the organic light-emitting layer 124 also equals to 0. When the electrical difference between the second electrode 122 (−D) and the first electrode 121 (+S) is larger than 0, the free electrons on the organic light-emitting layer 124 are driven to form a current Id1.

If the negative voltage of the third electrode 123 (G) with respect to the first electrode 121 (+S) increases, the inverse bias-voltage of the interface between the third electrode 123 (G) and the organic light-emitting layer 124 increases as well. As a result, the void 124a is expanded, the cross-sectional area which the current flows through is compressed, the resistance is increased, and the volume of the current Id1 flowing through the organic light-emitting layer 124 is decreased. Therefore, the volume of the current Id1 can be controlled by adjusting the voltage difference between the third electrode 123 (G) and the first electrode 121 (+S).

The first electrode 121 (+S), the second electrode 122 (−D) and the third electrode 123 (G) can be made from indium tin oxide (ITO), magnesium (Mg) or silver (Ag). However, the determination of the material of the first electrode 121 (+S), the second electrode 122 (−D) and the third electrode 123 (G) depends on the emitting path of the semiconductor element 120.

For example, if the first electrode 121 (+S) and the second electrode 122 (−D) are reflective electrodes and the third electrode 123 (G) is a transparent electrode, then the semiconductor element 120 is a top emission structure.

If the first electrode 121 (+S) and the second electrode 122 (−D) are transparent or semi-transparent electrodes and there is a reflective material disposed on the third electrode 123 (G), then the display pixel 120 is a bottom emission structure.

If the first electrode 121 (+S), the second electrode 122 (−D) and the third electrode 123 (G) are transparent or semi-transparent electrodes and there is no reflective material disposed on the third electrode 123 (G), then the semiconductor element 120 is a dual emission structure.

Figure 2:
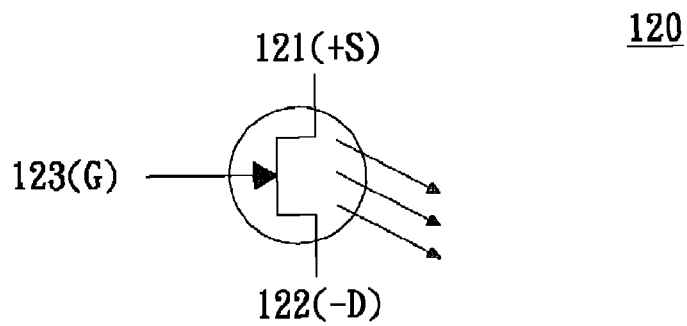
FIG. 2 is an equivalent circuit diagram according to the semiconductor element of FIG. 1.

Referring to FIG. 2, an equivalent circuit diagram according to the semiconductor element 120 of FIG. 1 is shown. In one aspect, the semiconductor element 120 originally only has the functions of a passive OLED. By means of the above structural design, the semiconductor element 120 further has an active P-channel JFET. Thus, the semiconductor element 120 becomes an OLED with self-adjusted luminance.

In another aspect, the semiconductor element 120 originally only has the functions of a P-channel JFET. By means of the above structural design, the semiconductor element 120 further has the functions of an OLED. Thus, the semiconductor element 120 becomes a light-emitting P-channel JFET.

Figure 3:
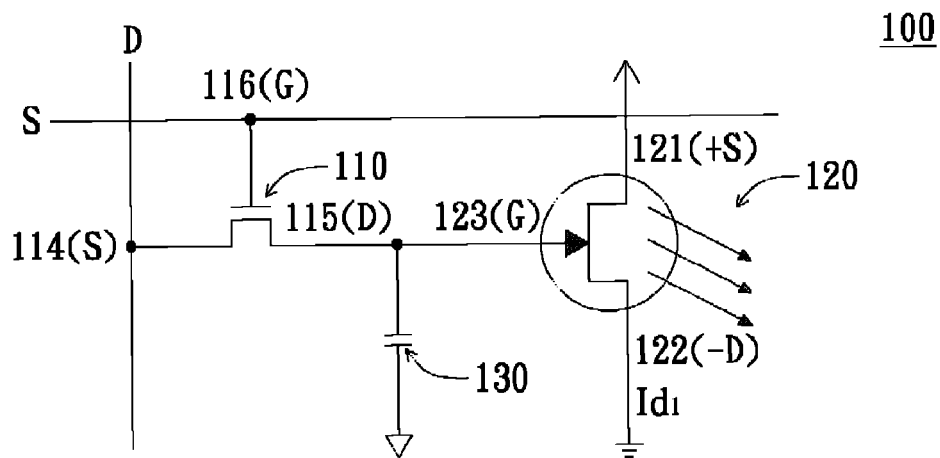
FIG. 3 is a display pixel using the semiconductor element of FIG. 1.

Referring to FIG. 3, a perspective of a display pixel using the semiconductor element 120 of FIG. 1 is shown. The display pixel 100 includes a first semiconductor element 110, a second semiconductor element 120 and a capacitor 130. The first semiconductor element 110 is electrically connected with the second semiconductor element 120.

In greater details, the first semiconductor element 110 is a P-channel transistor or an N-channel transistor. In the present embodiment of the invention, the first semiconductor element 110 is exemplified by a P-channel transistor. The first semiconductor element 110 includes a fourth electrode 114, a fifth electrode 115 and a sixth electrode 116, wherein the fourth electrode 114, the fifth electrode 115 and the sixth electrode 116 respectively are the source, the drain and the gate of the P-channel transistor. For convenience of elaboration, the fourth electrode 114 is further marked by (S) and becomes 114 (S); the fifth electrode 115 is further marked by (D) and becomes 115 (D); the sixth electrode 116 is further marked by (G) and becomes 116 (G).

The sixth electrode 116 (G) is electrically connected with a scan line S; the fourth electrode 114 (S) is electrically connected with a data line D; the fifth electrode 115 (D) is electrically connected with the third electrode 123 (G). The first electrode 121 (+S) is electrically connected with the anode; the second electrode 122 (−D) is electrically connected with the cathode.

The scan lines S can turn on the first semiconductor element 110 and store the bias-voltage of the data line D in the capacitor 130. As the bias-voltage stored in the capacitor 130 changes, the bias-voltage of the third electrode 123 (G) changes accordingly. Meanwhile, the volume of the current Id1 flowing through the first electrode 121 (+S) and the second electrode 122 (−D) also changes accordingly. Therefore, the luminance of the second semiconductor element 120 changes accordingly.

Besides, several display pixels 100 are arranged in a matrix, and several data lines D and several scan lines S are provided. After each display pixel 100 is electrically connected with one of the data lines D and one of the scan lines S, a display panel is formed.

Through the above arrangement, each display pixel 100 of the display panel is capable of actively controlling the luminance by incorporating two transistors (that is, the first the transistor 110 and the second the transistor 120) with one capacitor 130, not only reducing material cost but also simplifying the manufacturing process.

Second Embodiment

Figure 4:
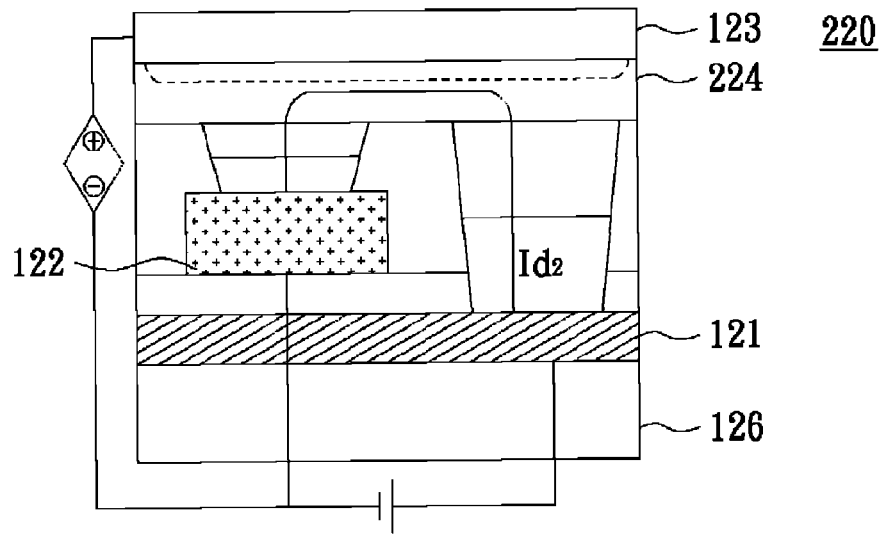
FIG. 4 is a semiconductor element according to a second embodiment of the invention.

The semiconductor element 220 and the display pixel 200 of the present embodiment of the invention differs with the semiconductor element 120 and the display pixel 100 of the first embodiment in that the organic light-emitting layer 224 of the semiconductor element 220 is doped with an N-type material, and the similarities common to the above two embodiments are not repeated here. Referring to FIG. 4, a perspective of a semiconductor element 220 according to a second embodiment of the invention is shown. The semiconductor element 220 includes a first electrode 121, a second electrode 122, an organic light-emitting layer 224 and a third electrode 123. The second electrode 122 and the first electrode 121 are disposed separately. The organic light-emitting layer 224 is disposed above the first electrode 121 and the second electrode 122. The organic light-emitting layer 224 is electrically connected with the first electrode 121 and the second electrode 122. The third electrode 123 is disposed above the organic light-emitting layer 224.

In the present embodiment of the invention, the first electrode 121 is an anode, and the second electrode 122 is a cathode. Therefore, the first electrode 121, the second electrode 122 and the organic light-emitting layer 224 can be incorporated to form an OLED. To facilitate the elaboration of the polarities of the first electrode 121 and the second electrode 122, the first electrode 121 is further marked by (+) and becomes 121 (+), and the second electrode 122 is further marked by (−) and becomes 122 (−).

The organic light-emitting layer 224 of the present embodiment of the invention is doped with an N-type material such as lithium (Li). The first electrode 121, the second electrode 122, the third electrode 123, the organic light-emitting layer 224 can be incorporated to form an N-channel junction type field effect transistor (NJFET).

In greater details, the first electrode 121, the second electrode 122 and the third electrode 123 respectively are a drain, a source and a gate of an N-channel JFET. The organic light-emitting layer 224 is an N-channel. For convenience of elaboration, the first electrode 121 (+) is further marked by (D) and becomes 121 (+D); the second electrode 122 (−) is further marked by (S) and becomes 122 (−S); the third electrode 123 is further marked by (G) and becomes 123 (G).

Figure 5:
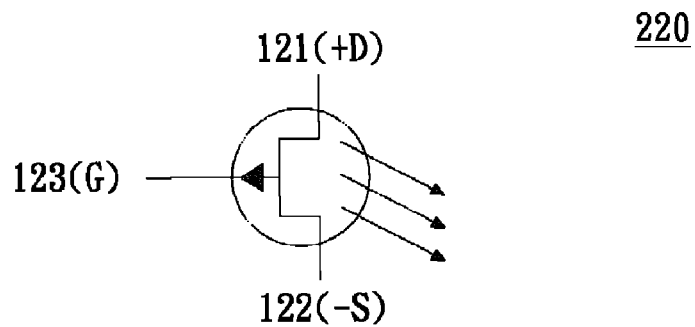
FIG. 5 is an equivalent circuit diagram according to the semiconductor element of FIG. 4.

Referring to FIG. 5, an equivalent circuit diagram according to the semiconductor element of FIG. 4 is shown. In one aspect, the semiconductor element 220 originally only has the functions of a passive OLED. By means of the above structural design, the semiconductor element 220 further has an active N-channel JFET. Thus, the semiconductor element 220 becomes an OLED with self-adjusted luminance.

In another aspect, the semiconductor element 220 originally only has the functions of an N-channel JFET. By means of the above structural design, the semiconductor element 220 further has the functions of an OLED, therefore the semiconductor element 220 becomes a light-emitting N-channel JFET.

Figure 6:
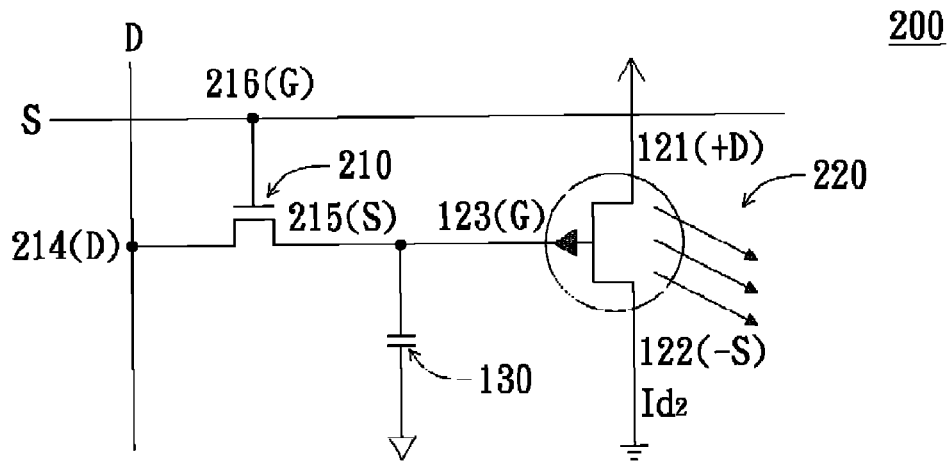
FIG. 6 is a display pixel using the semiconductor element of FIG. 4.

Referring to FIG. 6, a perspective of a display pixel using the semiconductor element of FIG. 4 is shown. The display pixel 200 includes a first semiconductor element 210 and a second semiconductor element 220. The first semiconductor element 210 is electrically connected with the second semiconductor element 220.

The first semiconductor element 210 includes a fourth electrode 214, a fifth electrode 215 and a sixth electrode 216, wherein the fourth electrode 214, the fifth electrode 215 and the sixth electrode 216 respectively are the drain, the source and the gate of an N-channel transistor. For convenience of elaboration, the fourth electrode 214 is further marked by (D) and becomes 214 (D); the fifth electrode 215 is further marked by (S) and becomes 215 (S); the sixth electrode 216 is further marked by (G) and becomes 216 (G).

The sixth electrode 216 (G) is electrically connected with a scan line S. The fourth electrode 214 (D) is electrically connected with a data line D. The fifth electrode 215 (S) is electrically connected with the third electrode 123 (G). The first electrode 121 (+S) is electrically connected with the anode. The second electrode 122 (−D) is electrically connected with the cathode.

The first semiconductor element 210 is a P-channel transistor or an N-channel transistor. In the present embodiment of the invention, the first semiconductor element 210 is exemplified by an N-channel transistor. As both the first semiconductor element 210 and the second semiconductor element 220 are N-channel transistors, the manufacturing process is further simplified.

As indicated in FIG. 6, the scan line S can turn on the first semiconductor element 210 and store the bias-voltage of the data lines D in the capacitor 130. As the bias-voltage stored in the capacitor 130 changes, the bias-voltage of the third electrode 123 (G) also changes accordingly. Meanwhile, the volume of the current Id2 flowing through the first electrode 121 (+D) and the second electrode 122 (−S) also changes. Therefore, the luminance of the second semiconductor element 220 changes accordingly.

Third Embodiment

Figure 7:
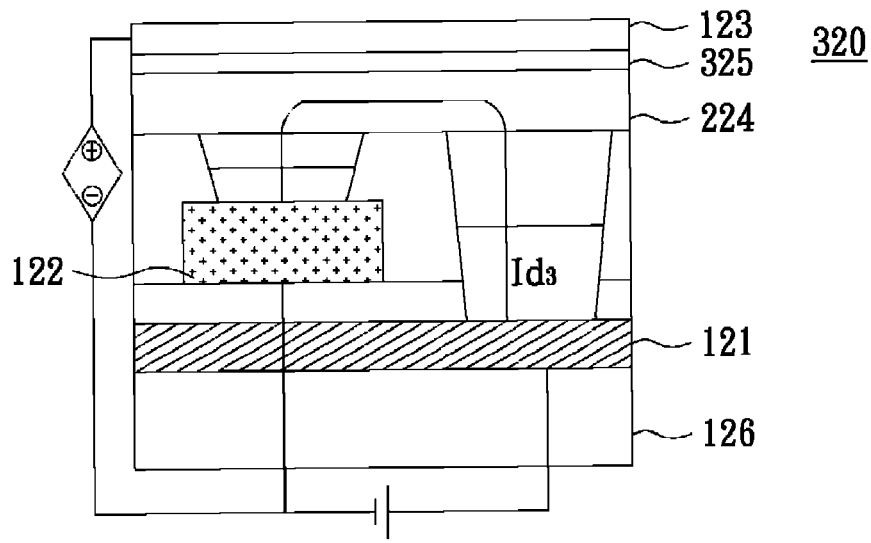
FIG. 7 is a semiconductor element according to a third embodiment of the invention.

The semiconductor element 320 and the display pixel 300 of the present embodiment of the invention differ with the semiconductor element 120 and the display pixel 100 of the first embodiment in that semiconductor element 320 further has an insulating layer 325 disposed between the third electrode 123 (G) and the organic light-emitting layer 124, and the similarities common to the above two embodiments are not repeated here. Referring to FIG. 7, a perspective of a semiconductor element 320 according to a third embodiment of the invention is shown. The semiconductor element 320 includes a first electrode 121 (+S), a second electrode 122 (−D), an organic light-emitting layer 124, a third electrode 123 (G) and an insulating layer 325. The insulating layer 325 is disposed above the organic light-emitting layer 124. The third electrode 123 (G) is disposed above the insulating layer 325.

The first electrode 121 (+S), the second electrode 122 (−D), the third electrode 123 (G), the organic light-emitting layer 124 and the insulating layer 325 can be incorporated to form a P-channel metal-oxide-semiconductor (PMOS).

In greater details, the first electrode 121 (+S), the second electrode 122 (−D) and the third electrode 123 (G) respectively are a source, a drain and a gate of a PMOS. The organic light-emitting layer 124 is a P-channel.

Figure 8:
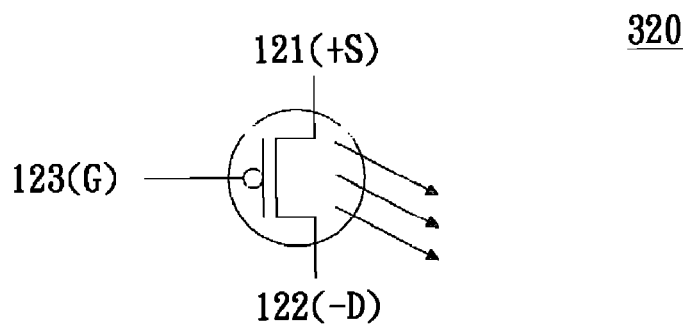
FIG. 8 is an equivalent circuit diagram according to the semiconductor element of FIG. 7.

Referring to FIG. 8, an equivalent circuit diagram according to the semiconductor element 320 of FIG. 7 is shown. In one aspect, the semiconductor element 320 originally only has the functions of a passive OLED. By means of the above structural design, the semiconductor element 320 further has the functions of an active PMOS. Thus, the semiconductor element 320 becomes an OLED with self-adjusted luminance.

In another aspect, the semiconductor element 320 originally only has the functions of PMOS. By means of the above structural design, the semiconductor element 320 further has the functions of an OLED, therefore the semiconductor element 320 becomes a light-emitting PMOS.

Figure 9:
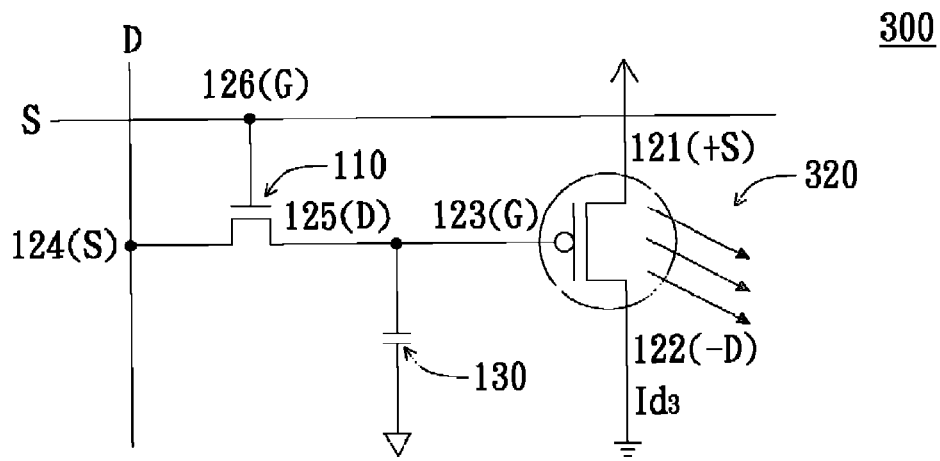
FIG. 9 is a display pixel using the semiconductor element of FIG. 7.

Referring to FIG. 9, a perspective of a display pixel using the semiconductor element of FIG. 7 is shown. The display pixel 300 includes a first semiconductor element 110 and a second semiconductor element 320. The first semiconductor element 110 is electrically connected with the second semiconductor element 320. The connecting relationship among the first semiconductor element 110, the scan line S, the data line D and the second semiconductor element 320 is similar to that among the first semiconductor element 110, the scan line S, the data line D and the second semiconductor element 120 of the first embodiment, and is not repeated here.

As indicated in FIG. 9, the first semiconductor element 110 includes a fourth electrode 114 (S), a fifth electrode 115 (D) and a sixth electrode 116 (G). The scan line S can turn on the first semiconductor element 110 and store the bias-voltage of the data lines D in the capacitor 130. As the bias-voltage stored in the capacitor 130 changes, the bias-voltage of the third electrode 123 (G) also changes accordingly. Meanwhile, the volume of the current Id3 flowing through the first electrode 121 (+S) and the second electrode 122 (−D) changes accordingly. Therefore, the luminance of the second semiconductor element 320 changes accordingly.

Fourth Embodiment

Figure 10:
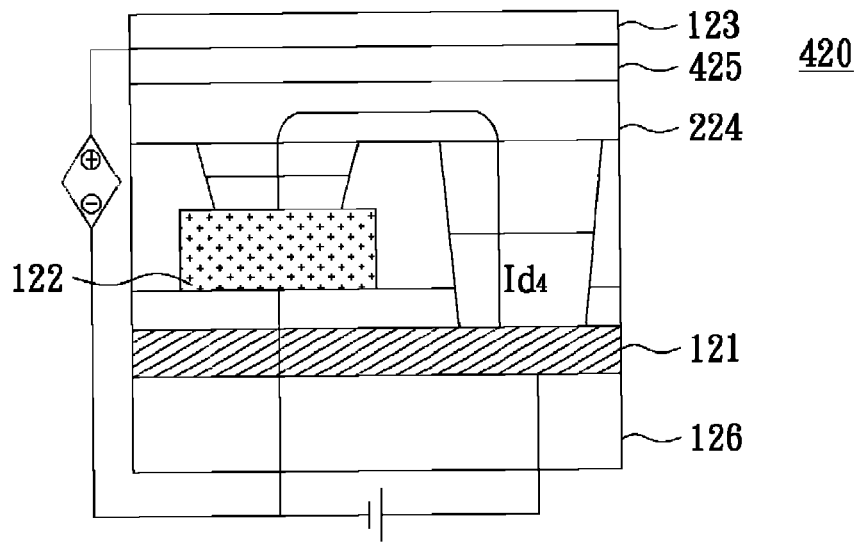
FIG. 10 is a semiconductor element according to a fourth embodiment of the invention.

The semiconductor element 420 and the display pixel 400 of the present embodiment of the invention differ with the semiconductor element 220 and the display pixel 200 of the second embodiment in that the semiconductor element 420 further has an insulating layer 425 disposed between the third electrode 123 and the organic light-emitting layer 224, and the similarities common to the above two embodiments are not repeated here. Referring to FIG. 10, a perspective of a semiconductor element 420 according to a fourth embodiment of the invention is shown. The semiconductor element 420 includes a first electrode 121 (+D), a second electrode 122 (−S), an organic light-emitting layer 224, a third electrode 123 (G) and an insulating layer 425. The insulating layer 425 is disposed above the organic light-emitting layer 224. The third electrode 123 (G) is disposed above the insulating layer 425.

The first electrode 121 (+D), the second electrode 122 (−S), the third electrode 123 (G), the organic light-emitting layer 224 and the insulating layer 425 can be incorporated to form an N-channel metal-oxide-semiconductor (NMOS).

In greater details, the first electrode 121 (+D), the second electrode 122 (−S) and the third electrode 123 (G) respectively are a drain, a source and a gate of an NMOS. The organic light-emitting layer is an N-channel.

Figure 11:
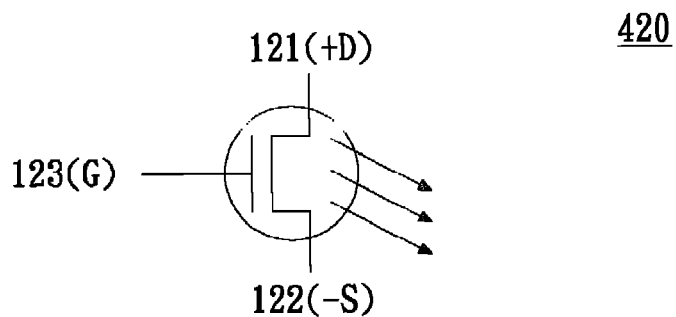
FIG. 11 is an equivalent circuit diagram according to the semiconductor element of FIG. 10.

Referring to FIG. 11, an equivalent circuit diagram according to the semiconductor element 420 of FIG. 10 is shown. In one aspect, the semiconductor element 420 originally only has the functions of a passive OLED. By means of the above structural design, the semiconductor element 420 further has the functions of an active NMOS. Thus, the semiconductor element 420 becomes an OLED with self-adjusted luminance.

In another aspect, the semiconductor element 420 originally only has the functions of an NMOS. By means of the above structural design, the semiconductor element 420 further has the functions of an OLED, therefore the semiconductor element 420 becomes a light-emitting NMOS.

Figure 12:
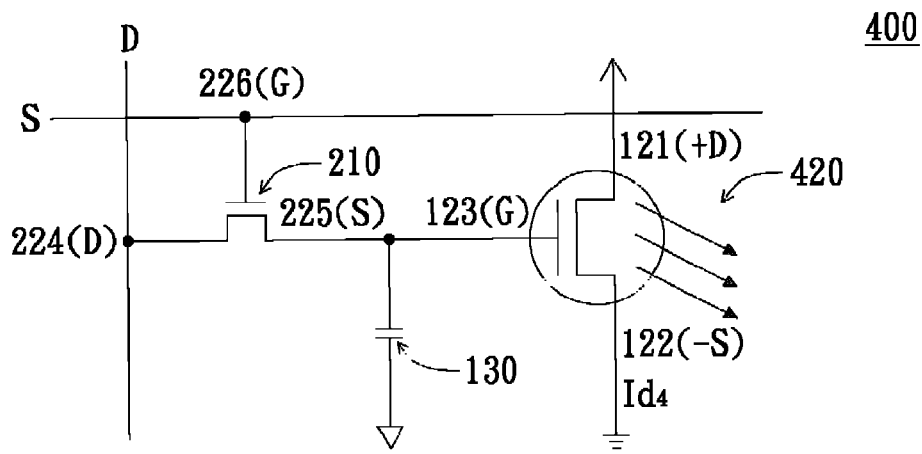
FIG. 12 is a display pixel using the semiconductor element of FIG. 10.

Referring to FIG. 12, a perspective of a display pixel using the semiconductor element 420 of FIG. 10 is shown. The display pixel 420 includes a first semiconductor element 210 and a second semiconductor element 420. The first semiconductor element 210 is electrically connected with the first semiconductor element 420. The connecting relationship among the first semiconductor element 210, the scan line S, the data line D and the second semiconductor element 420 is similar to that among the first semiconductor element 210, scan line S, data line D and the second semiconductor element 220 of the second embodiment, and is not repeated here.

As indicated in FIG. 12, the first semiconductor element 210 includes a fourth electrode 214 (D), a fifth electrode 215 (S) and a sixth electrode 216 (G). The scan line S can turn on the first semiconductor element 210 and store the bias-voltage of the data line D in the capacitor 130. As the bias-voltage stored in the capacitor 130 changes, the bias-voltage of the third electrode 123 (G) changes accordingly. Meanwhile, the volume of the current Id4 flowing through the first electrode 121 (+D) and the second electrode 122 (−S) also changes. Therefore, the luminance of the second semiconductor element 420 changes accordingly.

According to the semiconductor element and the display pixel and the display panel using the same disclosed in the above embodiments of the invention, a stacked structure formed by the first electrode, the second electrode, the third electrode and the organic light-emitting layer incorporates the functions of an OLED and a transistor in one single component, not only reducing material cost but also simplifying the manufacturing process.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display panel, comprising:
   a plurality of data lines;
   a plurality of scan lines; and
   a plurality of display pixels each electrically connected with one of the data lines and one of the scan lines, wherein each display pixel comprises:
   a first semiconductor element; and
   a second semiconductor element electrically connected with the first semiconductor element, the second semiconductor element comprising:
   a first electrode;
   a second electrode disposed separately from the first electrode;
   an organic light-emitting layer disposed above the first electrode and the second electrode, wherein the organic light-emitting layer is electrically connected with the first electrode and the second electrode; and
   a third electrode disposed above the organic light-emitting layer, wherein at least a part of the third electrode is in contact with the organic light-emitting layer.

2. The display panel according to claim 1, wherein the first semiconductor element is a transistor, a source or a drain of the first semiconductor element is electrically connected with the third electrode.

3. The display panel according to claim 1, wherein the organic light-emitting layer is doped with P-type material.

4. The display panel according to claim 3, wherein the P-type material is F4-TCNQ.

5. The display panel according to claim 3, wherein the first electrode and the second electrode respectively are an anode and a cathode of an OLED, the first electrode, the second electrode and the third electrode respectively are a source, a drain and a gate of a transistor.

6. The display panel according to claim 1, wherein the organic light-emitting layer is doped with N-type material.

7. The display panel according to claim 6, wherein the N-type material is lithium (Li).

8. The display panel according to claim 6, wherein the first electrode and the second electrode respectively are an anode and a cathode of an OLED, the first electrode, the second electrode and the third electrode respectively are a drain, a source and a gate of a transistor.

9. The display panel according to claim 1, wherein the third electrode is a transparent electrode.

\* \* \* \* \*

UNITED STATES PATENT AND TRADEMARK OFFICE
CERTIFICATE OF CORRECTION

PATENT NO. : 8,053,766 B2
APPLICATION NO. : 12/117597
DATED : November 8, 2011
INVENTOR(S) : Wang Page 1 of 1

It is certified that error appears in the above-identified patent and that said Letters Patent is hereby corrected as shown below:

On the title page, [73] Assignee: "Chimei Innolux Corporation, Chu-Nan (TW)" should be changed to:

-- [73] Assignee: Chimei Innolux Corporation, Chu-Nan (TW); Chi Mei El Corporation,
Tainan County (TW) --

Signed and Sealed this
Fourth Day of February, 2014

Michelle K. Lee
*Deputy Director of the United States Patent and Trademark Office*